(12) United States Patent
Park et al.

(10) Patent No.: US 8,815,687 B2
(45) Date of Patent: Aug. 26, 2014

(54) METHODS OF MANUFACTURING SEMICONDUCTOR DEVICES HAVING SPACERS DISPOSED ON AN INNER SIDEWALL OF A CONTACT HOLE FORMED IN A LAYER OF THE SEMICONDUCTOR DEVICES, AND A CONTACT PLUG DISPOSED THEREIN

(71) Applicant: Samsung Electronics Co., Ltd., Suwon-si (KR)

(72) Inventors: Jongchul Park, Hwaseong-si (KR); Sangsup Jeong, Suwon Si (KR); Byung-Jin Kang, Doaegu (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/057,079

(22) Filed: Oct. 18, 2013

(65) Prior Publication Data

US 2014/0042509 A1 Feb. 13, 2014

Related U.S. Application Data

(62) Division of application No. 13/306,112, filed on Nov. 29, 2011, now Pat. No. 8,581,314.

(30) Foreign Application Priority Data

Nov. 30, 2010 (KR) .......................... 10-2010-0120694

(51) Int. Cl.
*H01L 21/336* (2006.01)

(52) U.S. Cl.
USPC .... 438/270; 438/259; 438/330; 438/E21.646; 257/330

(58) Field of Classification Search
USPC ................ 438/300–301, 250–252, 259–261, 438/393–395, 396–397; 257/330–334, 139, 257/774, 751, E21.577
See application file for complete search history.

(56) References Cited

U.S. PATENT DOCUMENTS

| | | | |
|---|---|---|---|
| 6,812,072 B2 | 11/2004 | Jang et al. | |
| 2006/0022241 A1* | 2/2006 | Shimojo et al. | 257/296 |
| 2007/0267676 A1* | 11/2007 | Kim et al. | 257/311 |

FOREIGN PATENT DOCUMENTS

| | | |
|---|---|---|
| KR | 10-2005-0028961 | 3/2005 |
| KR | 10-0647468 | 11/2006 |
| KR | 10-0781547 | 11/2007 |

* cited by examiner

*Primary Examiner* — Dung A. Le
(74) *Attorney, Agent, or Firm* — Stanzione & Kim, LLP

(57) ABSTRACT

Provided are methods of manufacturing semiconductor devices. The method of manufacturing the semiconductor device may include forming a transistor on a substrate, the transistor having first and second doped regions, forming an interlayer dielectric on the substrate, forming a contact hole exposing the first doped region of the transistor, forming a spacer disposed on an inner sidewall of the contact hole, and filling the contact hole provided with the spacer with a conductive layer to form a contact plug.

4 Claims, 17 Drawing Sheets

METHODS OF MANUFACTURING SEMICONDUCTOR DEVICES HAVING SPACERS DISPOSED ON AN INNER SIDEWALL OF A CONTACT HOLE FORMED IN A LAYER OF THE SEMICONDUCTOR DEVICES, AND A CONTACT PLUG DISPOSED THEREIN

CROSS-REFERENCE TO RELATED APPLICATIONS

This U.S. non-provisional patent application is a Divisional Application of prior application Ser. No. 13/306,112, filed on Nov. 29, 2011 in the United States Patent and Trademark Office, which claims priority under 35 U.S.C. §119 to Korean Patent Application No. 10-2010-0120694, filed on Nov. 30, 2010, in the Korean Intellectual Property Office, the entire contents of which are hereby incorporated by reference.

BACKGROUND

1. Field

Exemplary embodiments of the general inventive concept relate generally to semiconductor devices and methods of fabricating the same. More particularly, the exemplary embodiments of the general inventive concept relate to semiconductor devices provided with a recess channel region and methods of fabricating the same.

2. Description of the Related Art

With increasing integration density of semiconductor memory devices, a critical dimension of a pattern is decreasing. For example, for a dynamic random access memory DRAM, it is needed to decrease line widths of word lines and areas of source and drain regions disposed between the word lines. Thus, there may occur technical issues, such as an electric short or a cross-talking, between a contact plug connecting the source/drain region with a bit line and a word line adjacent to the contact plug.

SUMMARY

Exemplary embodiments of the general inventive concept provide semiconductor devices having contact plugs with increased electric reliability.

Additional aspects and advantages of the present general inventive concept will be set forth in part in the description which follows and, in part, will be obvious from the description, or may be learned by practice of the general inventive concept.

Other embodiments of the general inventive concept provide methods of fabricating semiconductor devices whose contact plugs have increased electric reliability.

According to exemplary embodiments of the general inventive concept, a semiconductor device may include a substrate provided with a transistor, an insulating layer disposed on the substrate, the insulating layer including a contact hole exposing a portion of the transistor, a spacer disposed on an inner sidewall of the contact hole, and a contact plug disposed in the contact hole. Here, a space defined by the spacer may increase in width from a bottom side thereof to a top side thereof.

In some exemplary embodiments, the contact plug may include, for example, a lower portion being in contact with the spacer, and an upper portion spaced apart from the spacer. Here, the upper portion of the contact plug may be, for example, upwardly tapered.

In other exemplary embodiments, a top surface of the spacer may be, for example, positioned at the same level as that of the insulating layer.

In other exemplary embodiments, a bottom surface of the contact plug may be, for example, positioned at a lower level than a top surface of the substrate.

In other exemplary embodiments, a bottom surface of the spacer may be, for example, positioned at a lower level than a top surface of the substrate.

In yet other exemplary embodiments, the transistor may include, for example, a recessed channel region formed in the substrate, a gate electrode disposed in the recessed channel region, a top surface of the gate electrode being lower than that of the substrate, a gate insulating layer interposed between the substrate and the gate electrode, and first and second doped regions formed in the substrate adjacent to the gate electrode. Here, the first doped region may be, for example, exposed by the contact hole.

In further exemplary embodiments, the semiconductor device may further include, for example, a conductive pattern electrically connected to the contact plug.

According to other exemplary embodiments of the general inventive concept, a semiconductor device may include, for example, a substrate including an active region having an elliptical shape and a field region confining the active region, a gate electrode having a top surface lower than that of the substrate, the gate electrode having a linear shape whose major axis is not parallel to a major axis of the active region, a gate insulating layer interposed between the substrate and the gate electrode, first and second doped regions formed in the active region adjacent to the gate electrode, a first interlayer dielectric provided with a contact hole exposing a top surface of the first doped region, a spacer disposed on an inner sidewall of the contact hole, a first contact plug in the contact hole, a bit line electrically connected to the first contact plug, the bit line extending perpendicular to the major axis of the gate electrode, a second interlayer dielectric covering the bit line, a second contact plug electrically connected to the second doped region through the first and second interlayer dielectrics, and a capacitor electrically connected to the second contact plug. Here, a space defined by the spacer may, for example, increase in width from a bottom side thereof to a top side thereof.

In some other exemplary embodiments, the second contact plug may include, for example, a portions being in contact with the second doped region and the spacer, respectively.

In other exemplary embodiments, a bottom surface of the second contact plug may be, for example, positioned at a higher level than a bottom surface of the first contact plug.

In other exemplary embodiments, the first contact hole may, for example, have a greater area than the second contact plug.

In other exemplary embodiments, a width of the first contact hole may be, for example, greater than that of the first doped region.

In other exemplary embodiments, the number of the active region may be, for example, plural, and the plurality of the active regions may be, for example, arranged apart from each other along directions substantially parallel to the major axes of the active region and the gate electrode.

According to other exemplary embodiments of the general inventive concept, a method of fabricating a semiconductor device may include forming a transistor on a substrate, forming a first interlayer dielectric on the substrate, etching the first interlayer dielectric to form a first contact hole exposing a portion of the transistor, forming a spacer on an inner sidewall of the first contact hole, and filling the first contact hole provided with the spacer with a conductive layer to form a first contact plug.

In other exemplary embodiments, the method may further include, for example, forming a bit line electrically connected to the first contact plug, forming a second interlayer dielectric covering the bit line, etching the first and second interlayer dielectrics to form a second contact hole exposing the second doped region, filling the second contact hole with a conductive layer to form a second contact plug, and forming a capacitor electrically connected to the second contact plug, wherein the spacer may serve as an etch stop layer preventing the first doped region from being unintentionally etched during the forming of the second contact hole.

According other exemplary embodiments of the general inventive concept, a semiconductor device may include, for example, a substrate provided with a transistor having first and second doped regions, a first insulating layer disposed on the substrate, a first contact hole formed in the first insulating layer that exposes the first doped region, a spacer disposed on an inner sidewall of the first contact hole, a second insulating layer disposed on the first insulating layer, and a second contact hole formed in the first and second insulating layers that exposes the second doped region.

Further, in other exemplary embodiments, a first width defined by a distance between opposing internal surfaces of the spacer may decrease as a depth of the first contact hole increases, and a second width defined by a distance between opposing internal surfaces of the second contact hole may decrease as the depth of the second contact hole increases.

In other exemplary embodiments, a first contact plug is disposed in the first contact hole and electrically connected to the first doped region, and a second contact plug is disposed in the second contact hole and electrically connected to the second doped region.

In other exemplary embodiments, the first width may be narrower than a width of the first doped region.

In other exemplary embodiments, a width of a portion of the first contact plug that contacts the first doped region and electrically connects the first contact plug and the first doped region may be narrower than the width of the first doped region.

In other exemplary embodiments, the first contact hole has a depth less than a depth of the second contact hole.

In other exemplary embodiments, the first contact plug contacts a first surface of the spacer and the second contact plug contacts a second surface of the spacer opposite the first surface of the spacer.

In other exemplary embodiments, the first contact plug may be upwardly tapered such that the first contact plug is spaced from the spacer at a first depth of the first contact hole and the first contact plug contacts the spacer at a second depth of the first contact hole. In this case, the first depth may be less than the second depth.

In other exemplary embodiments, the second spacer may be disposed in a void that is formed between the spacer and the first contact plug at a portion of the first contact plug that is spaced from the spacer.

BRIEF DESCRIPTION OF THE DRAWINGS

The accompanying drawings are included to provide a further understanding of the general inventive concept, and are incorporated in, and constitute a part of, this specification. The drawings illustrate exemplary embodiments of the general inventive concept and, together with the description, serve to explain principles of the exemplary inventive concept.

FIGS. 2A through 13A and FIGS. 2B through 13B are cross-sectional views illustrating exemplary methods of fabricating the semiconductor device of FIG. 1A;

Figure 1A:
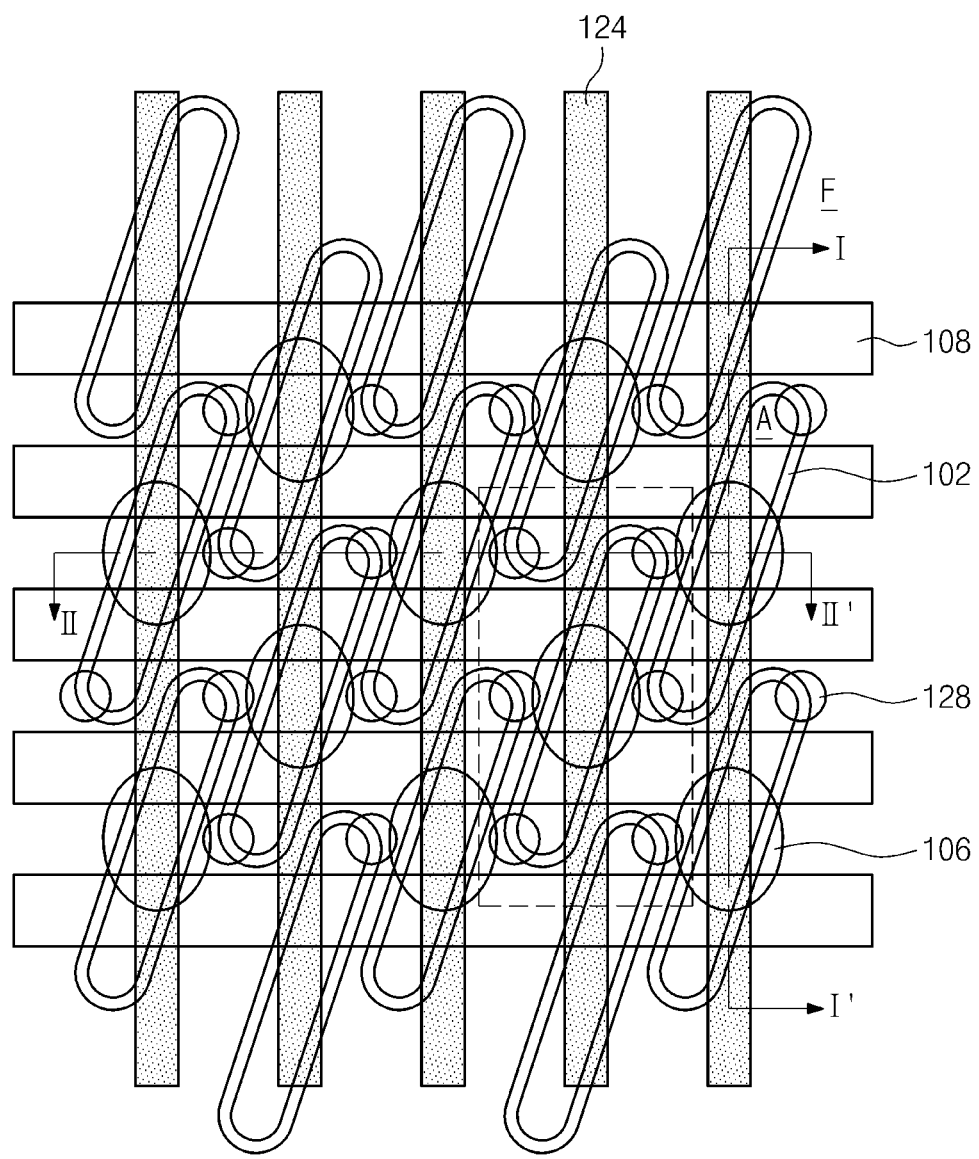
FIG. 1A is a plan view illustrating a semiconductor device according to exemplary embodiments of the general inventive concept.

It should be noted that these figures are intended to illustrate the general characteristics of methods, structure and/or materials utilized in certain exemplary embodiments and to supplement the written description provided below. These drawings are not, however, to scale and may not precisely reflect the precise structural or performance characteristics of any given exemplary embodiment, and should not be interpreted as defining or limiting the range of values or properties encompassed by the exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EXEMPLARY EMBODIMENTS

The general inventive concept will now be described with reference to the accompanying drawings, in which exemplary embodiments are shown. Exemplary embodiments of the general inventive concept may, however, be embodied in many different forms and should not be construed as being limited to the exemplary embodiments set forth herein; rather, these exemplary embodiments are provided so that this disclosure will be thorough and complete, and will fully convey the concept of the exemplary embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion e.g., "between" versus "directly between," "adjacent" versus "directly adjacent," "on" versus "directly on." As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to other elements or features as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented rotated 90 degrees or at other orientations and the spatially relative descriptors used herein interpreted accordingly.

The terminology used herein is for the purpose of describing particular exemplary embodiments only, and is not intended to be limiting of the exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments of the general inventive concept are described herein with reference to cross-sectional illustrations that are schematic illustrations of exemplary embodiments and intermediate structures of exemplary embodiments. As such, variations from the shapes of the illustrations as a result, for example, of manufacturing techniques and/or tolerances, are to be expected. Thus, exemplary embodiments of the general inventive concept should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms including technical and scientific terms used herein have the same meaning as commonly understood by one of ordinary skill in the art to which exemplary embodiments of the general inventive concept belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

[Methods of Fabricating Semiconductor Devices]

Figure 1B:
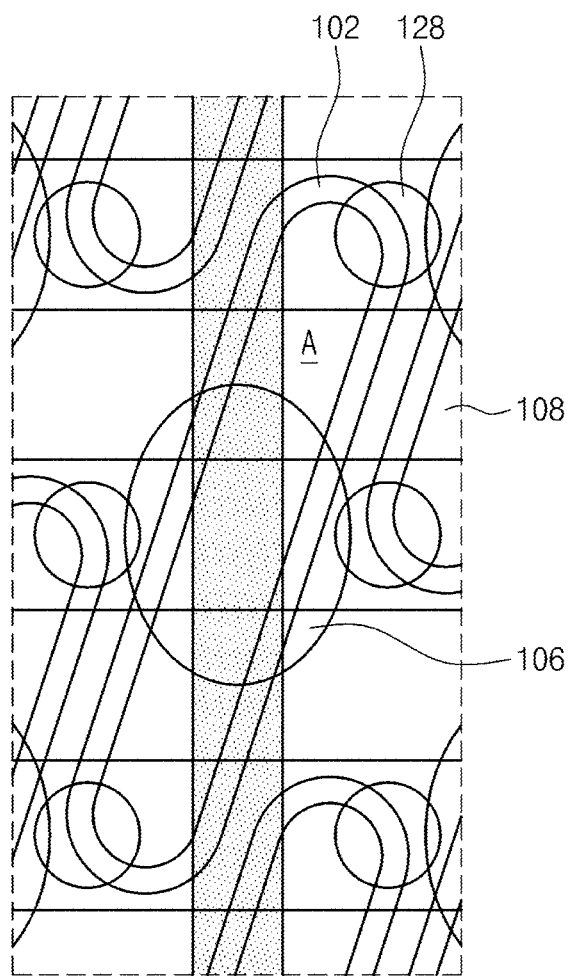
FIG. 1B is an enlarged plan view of a portion of FIG. 1A.
Figure 2A:
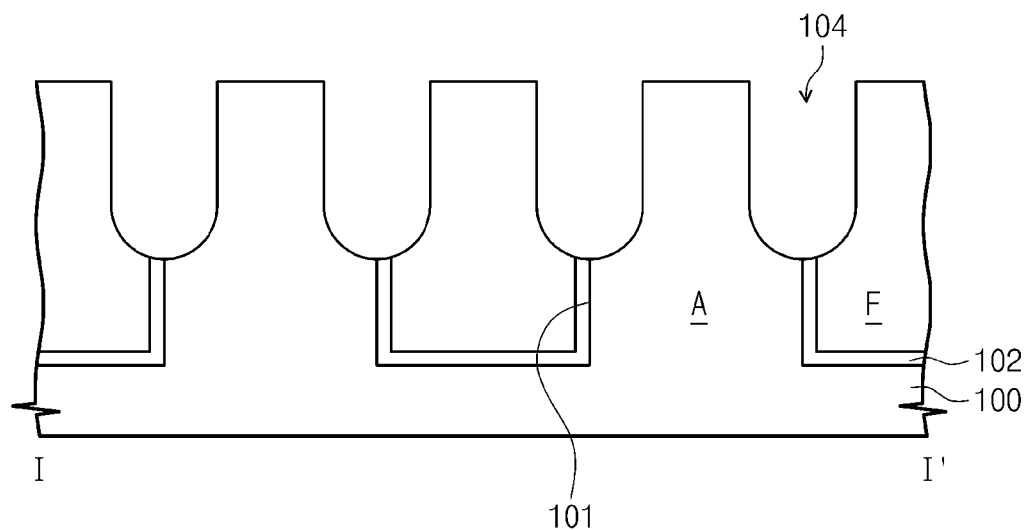
Figure 2B:
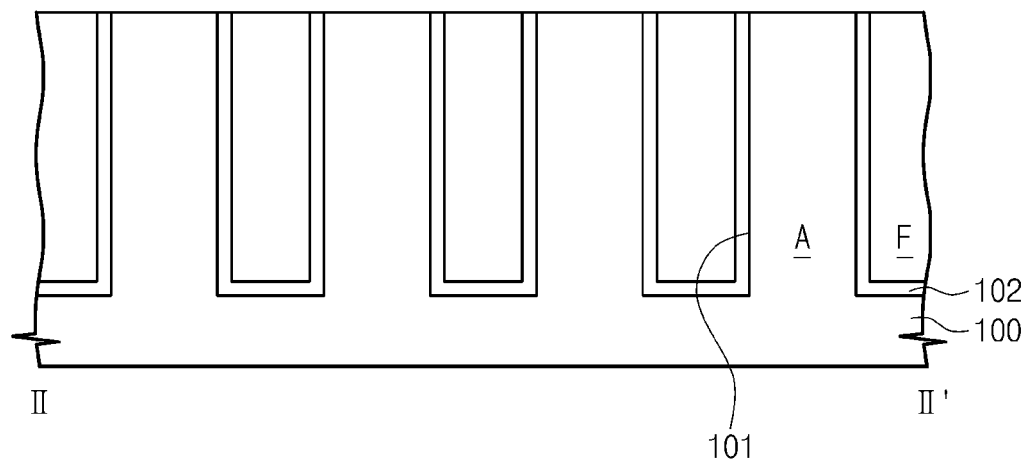

FIG. 1A is a plan view illustrating a semiconductor device according to exemplary embodiments of the inventive concept, and FIG. 1B is an enlarged plan view of a portion of FIG. 1A. FIGS. 2A through 13A and FIGS. 2B through 13B are cross-sectional views illustrating methods of fabricating the semiconductor device of FIG. 1A, where FIGS. 2A through 13A are sectional views taken along a line I-I' of FIG. 1A and FIGS. 2B through 13B are sectional views taken along a line II-II' of FIG. 1A.

Referring to FIGS. 1A, 1B, 2A, and 2B, a recess region 104 may be formed in a substrate 100 including an active region A and a field region F.

The field region F may be formed using a shallow trench isolation (STI) process. In more detail, the formation of the field region F may include a forming a trench 101 in the substrate 100 and forming a protection layer 102 on an inner sidewall of the trench 101. Here, the formation of the protection layer 102 may be performed to cure an etching damage on the substrate 100, which may occur during the formation of the trench 101. In addition, the protection layer 102 may prevent electric charges or charged ions from diffusing into the substrate 100 exposed by the trench 101. The formation of the field region F may include filling the trench 101 with an insulating layer such as an oxide layer or a nitride layer. The field region F may be formed to confine the active region A, and in certain embodiments, the active region A may have an elliptical shape with a major axis, which is parallel to a first direction, as shown in FIGS. 1A and 1B.

The recess region 104 may be formed by etching the substrate 100 having the active region A and the field region F. In some embodiments, the recess region 104 may be elongated along a second direction, which may be not parallel with the first direction. The active regions A may be disposed spaced apart from each other in the first and second directions, such that they are two-dimensionally arranged on the substrate 100. Here, the recess region 104 may be formed to cross the two-dimensionally arranged active regions A along the second direction.

Figure 3A:
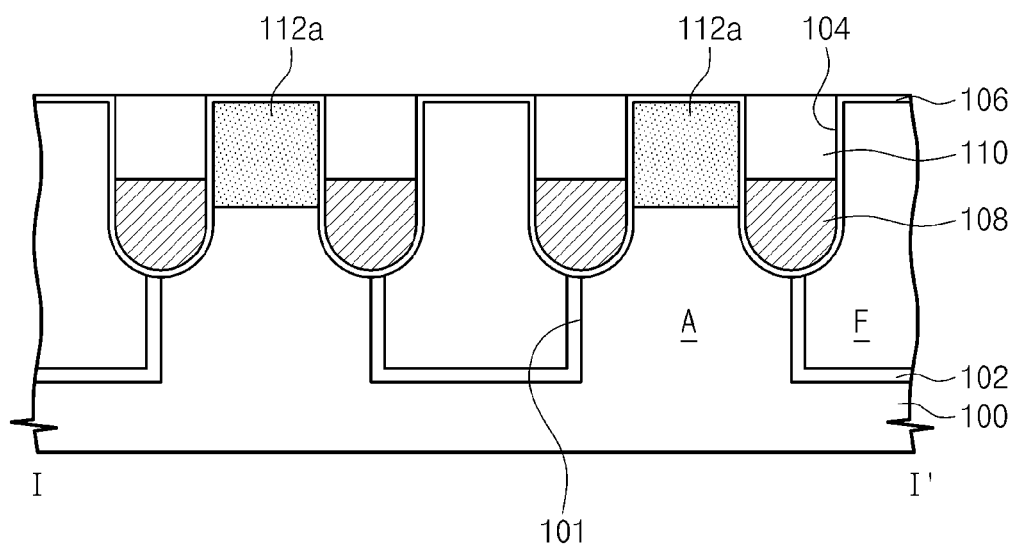
Figure 3B:
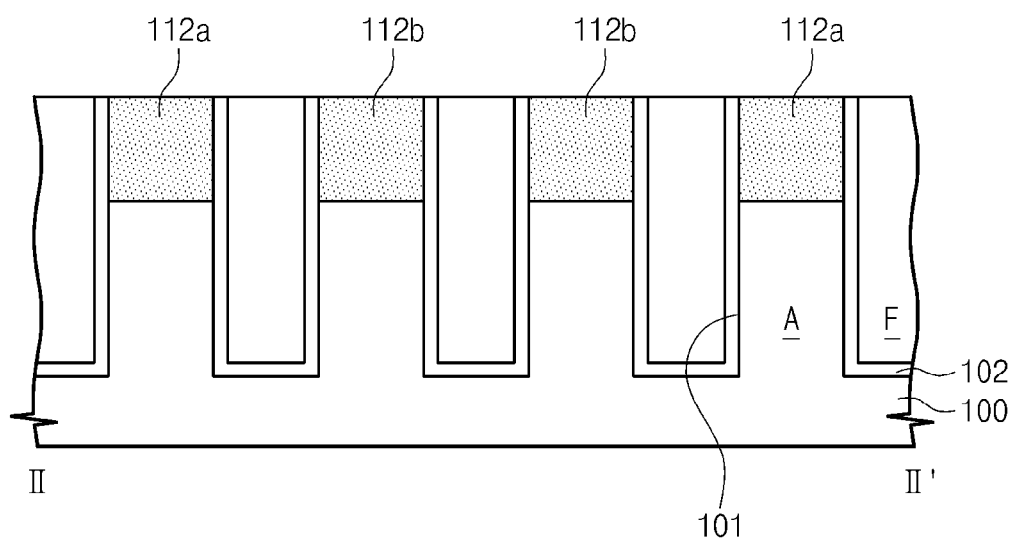

Referring to FIGS. 3A and 3B, a transistor T having a buried channel may be formed on the substrate 100 provided with the recess region 104.

According to some embodiments of the general inventive concept, the formation of the transistor T may include forming a gate insulating layer 106 on the substrate 100 provided with the recess region 104. The gate insulating layer 106 may be formed to cover an exposed surface of the substrate 100 such that the gate insulating layer 106 conforms to the exposed surface of the substrate 100 and not to fill the recess region 104. The gate insulating layer 106 may include, for example, a silicon oxide layer or a metal oxide layer.

A conductive layer may be formed to fill a lower portion of the recess region 104 provided with the gate insulating layer 106, thereby forming a gate electrode 108 elongated along the second direction. The conductive layer may include, for example, at least one of a doped silicon layer, a metal layer, or a metal compound layer. A top surface of the gate electrode 108 may be positioned substantially at a lower level than a top surface of the substrate 100. Thereafter, a mask 110 may be formed to fill an upper portion of the recess region 104. The mask 110 may include an insulating layer such as a nitride layer and an oxide layer.

First and second doped regions 112a and 112b may be formed by doping portions of the substrate 100 adjacent to the gate electrode 108 with impurities. This doping may be performed using an ion implantation process. Bottom surfaces of the first and second doped regions 112a and 112b may be positioned at a substantially lower level than a top surface of the gate electrode 108.

Figure 4A:
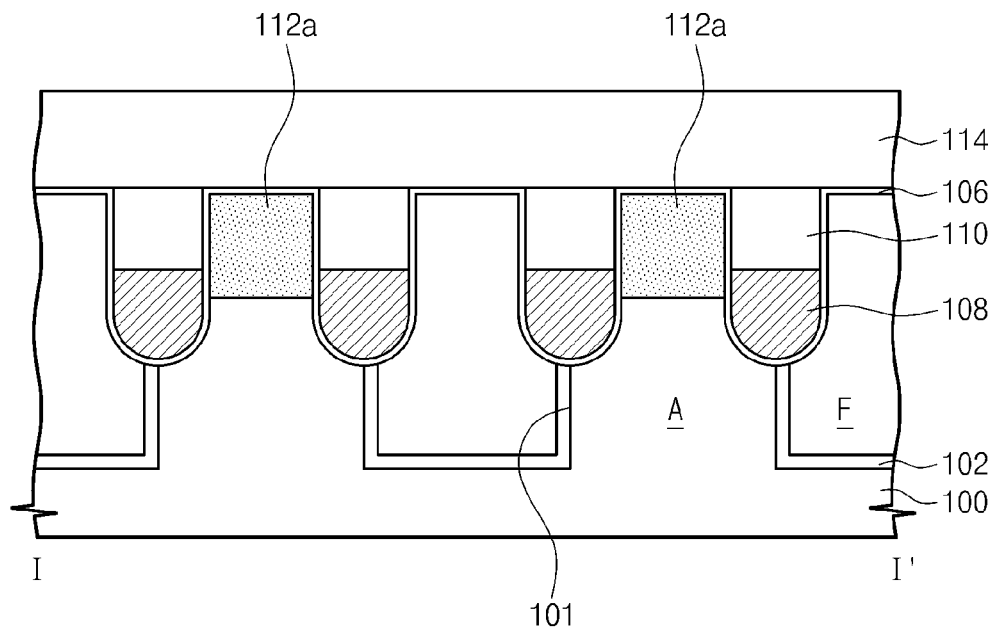
Figure 4B:
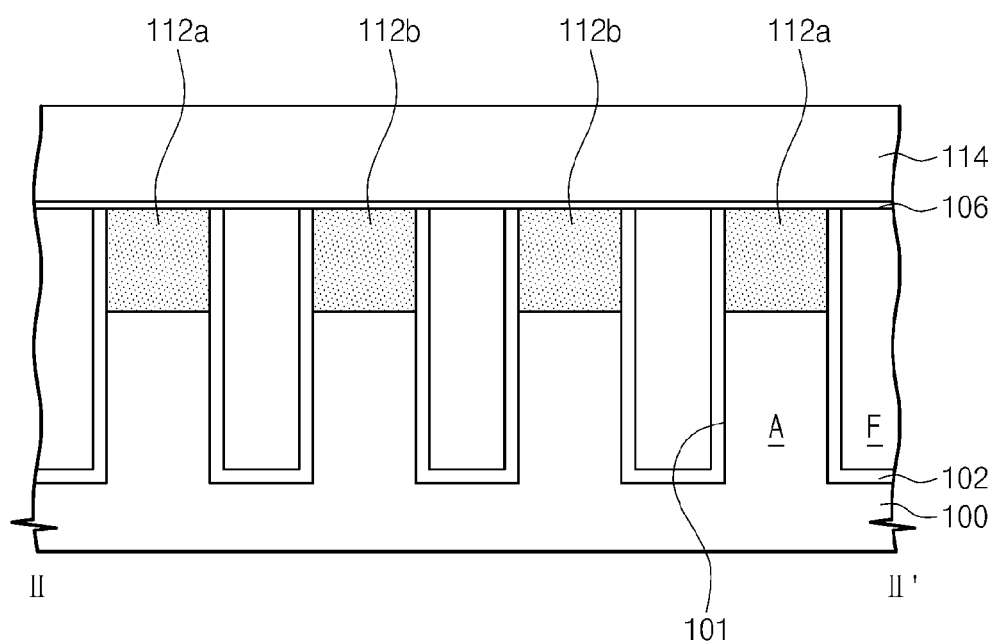

Referring to FIGS. 4A and 4B, a first interlayer dielectric 114 may be formed on the mask 110 and the substrate 100.

The first interlayer dielectric 114 may include an oxide layer such as a silicon oxide layer. Moreover, the first interlayer dielectric 114 may be formed to have a first height H1.

Figure 5A:
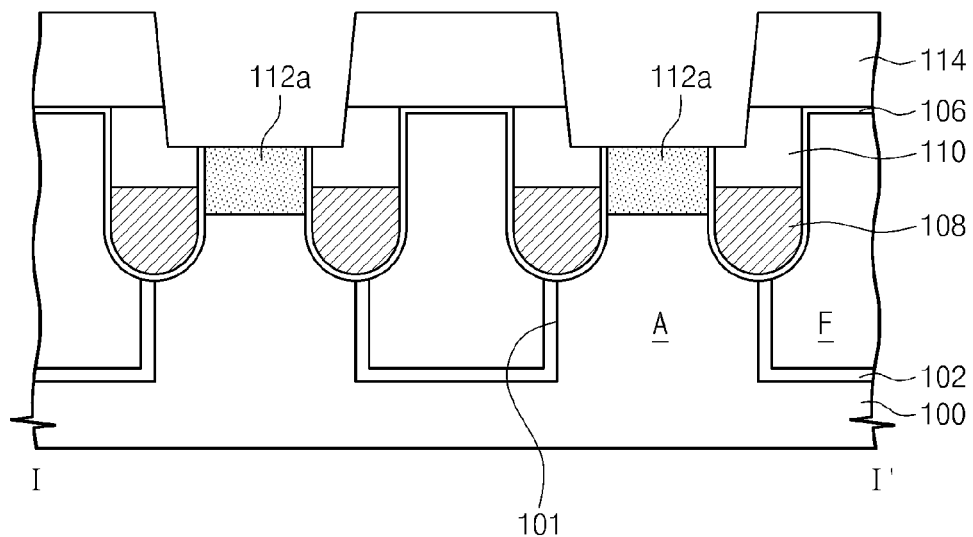
Figure 5B:
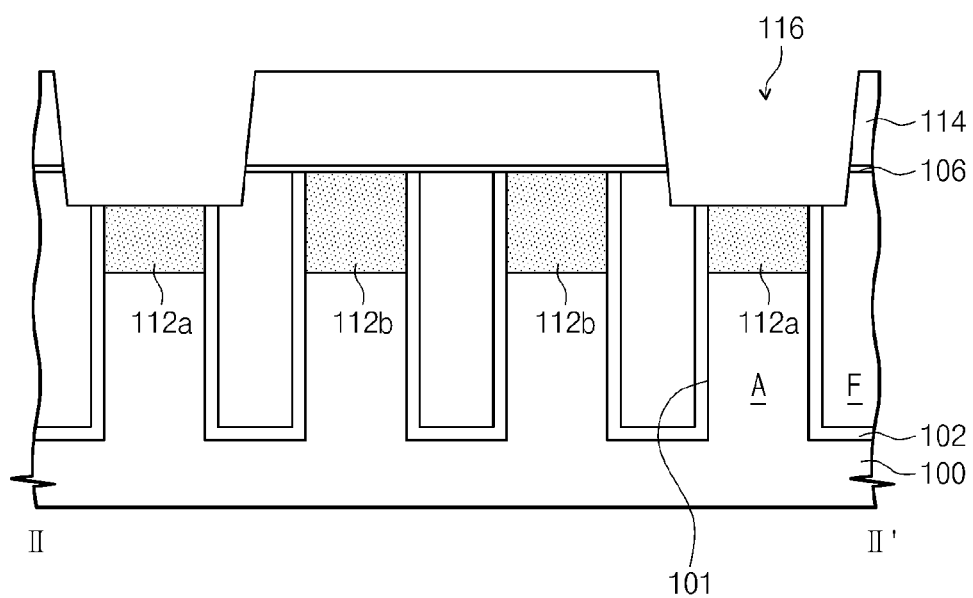

Referring to FIGS. 5A and 5B, the first interlayer dielectric 114 may be etched to form a first contact hole 116 exposing the first doped region 112a.

In certain exemplary embodiments, the first contact hole 116 may be formed by anisotropically etching the first interlayer dielectric 114. For example, the formation of the first contact hole 116 may be performed using a plasma etching technique or reactive ion etching technique. The first contact hole 116 may have a downwardly tapered shape as shown in FIGS. 5A and 5B, which may be a result of the anisotropic etching technique. That is, the width of the contact hole 116 may decrease as the depth of the first contact hole 116 increases.

Further, according to some exemplary embodiments of the general inventive concept, the first contact hole 116 may be formed to penetrate the first interlayer dielectric 114 completely therethrough and to form a partial recess within an upper portion of at least one of the mask 110 and the substrate 100. In this case, the first contact hole 116 may, however, be formed not to expose a top surface of the gate electrode 108. In addition, the first contact hole 116 may have substantially a wider width than the first doped region 112a. That is, the width of the first contact hole 116 may be wider than the first doped region 112a at all depths of the first contact hole 116.

Figure 6A:
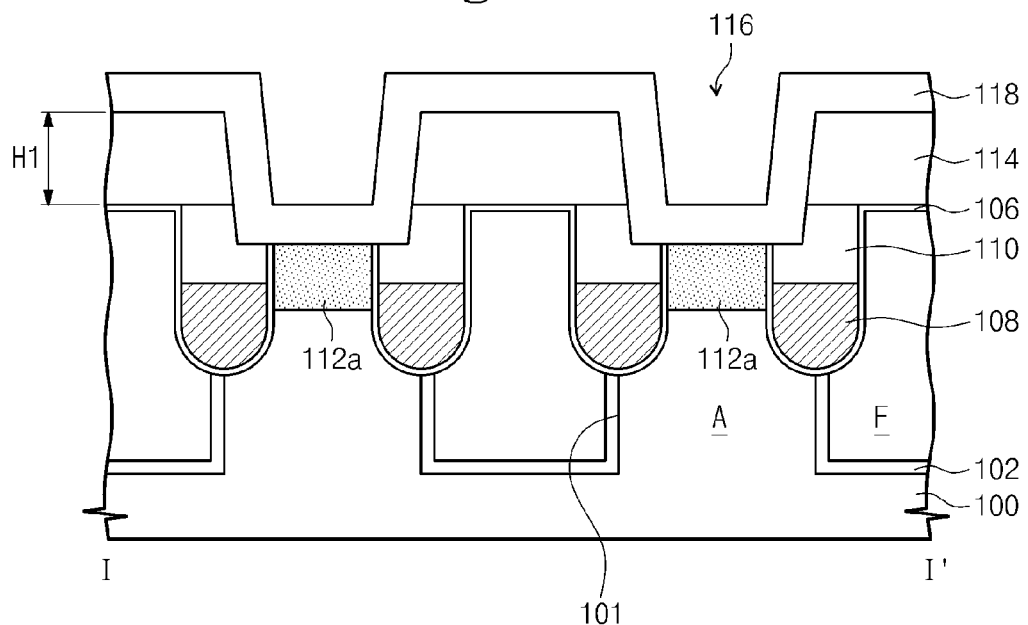
Figure 6B:
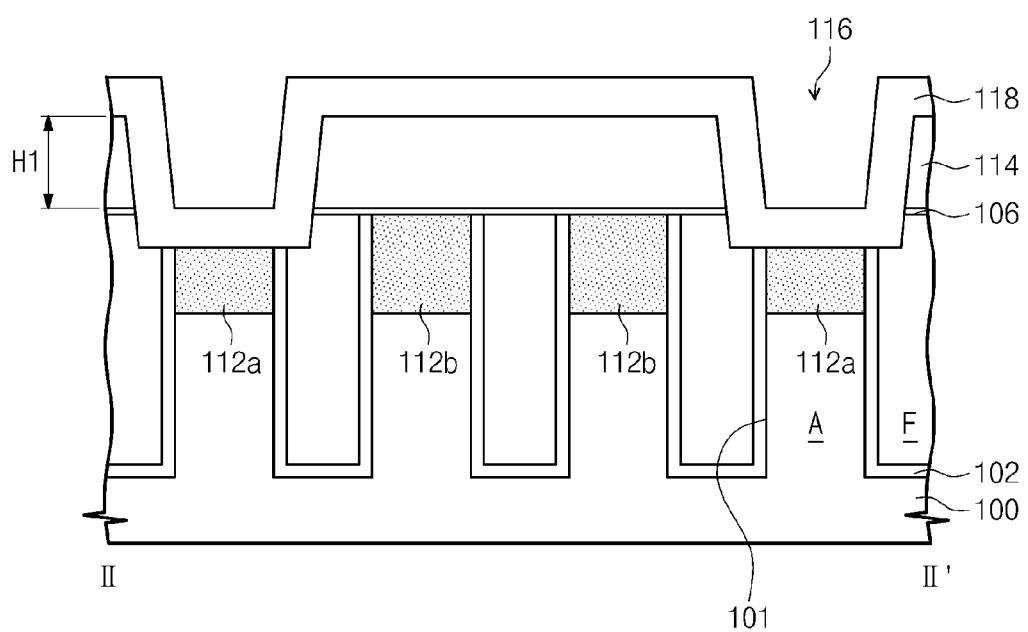

Referring to FIGS. 6A and 6B, a spacer layer 118 may be formed on the first interlayer dielectric 114 having the first contact hole 116 such that the spacer layer 118 conforms to the first interlayer dielectric 114 having the first contact hole 116.

In particular, the spacer layer 118 may be formed to cover an exposed surface of the first interlayer dielectric 114 such that the spacer layer 118 conforms to the exposed surface of the first interlayer dielectric 114 and not to fill the first contact hole 116. The spacer layer 118 may include a nitride layer such as a silicon nitride layer.

Figure 7A:
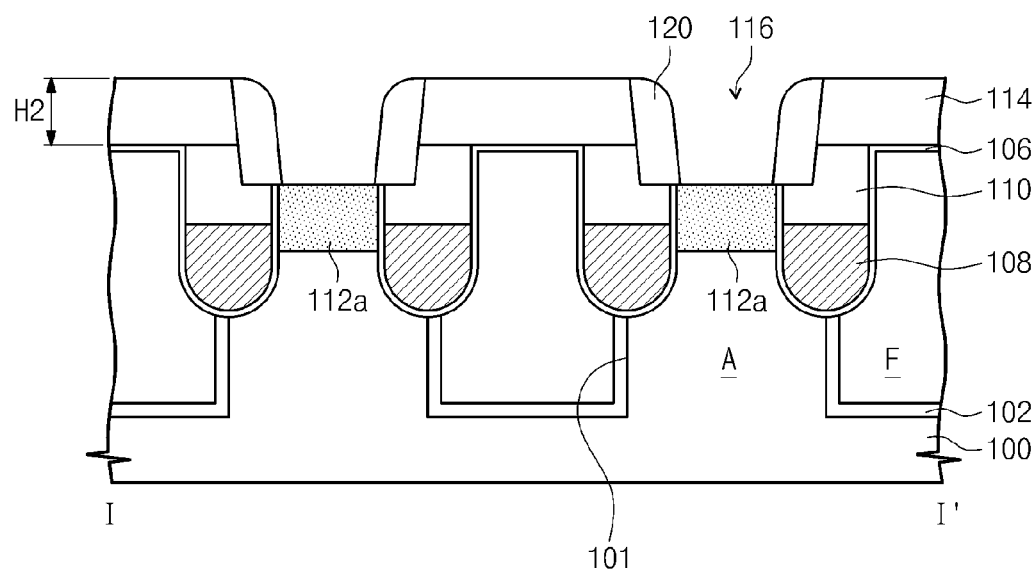
Figure 7B:
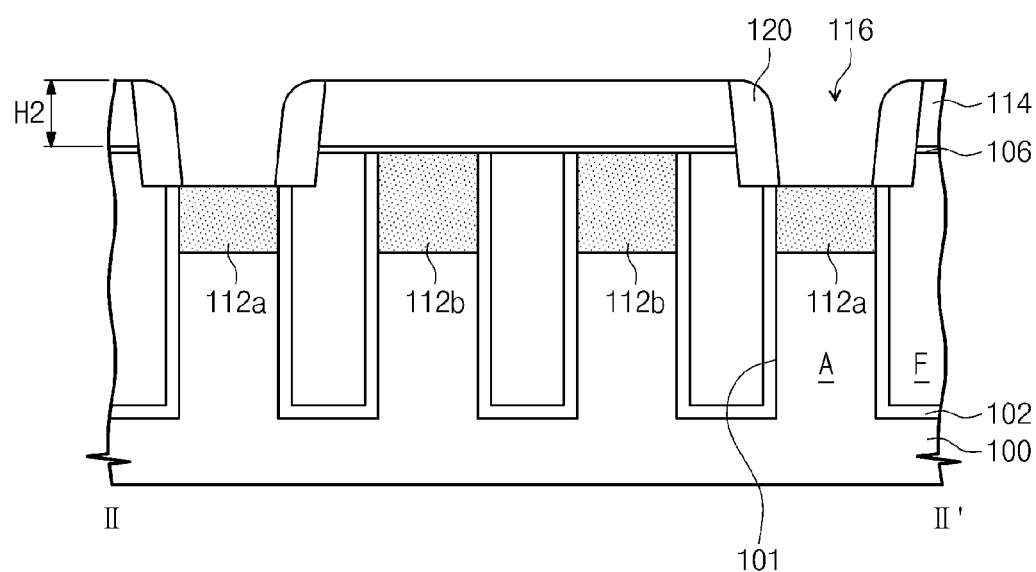

Referring to FIGS. 7A and 7B, the spacer layer 118 may be etched to form a spacer 120 disposed on an inner sidewall of the first contact hole 116.

The formation of the spacer 120 may be performed using an anisotropic etching process. In more detail, the formation of the spacer 120 may include selectively removing the spacer layer 118 from a top surface of the first interlayer dielectric 114 and a bottom surface of the first contact hole 116. As a result, the spacer 120 may be formed as a portion of the spacer layer 118 remaining on an inner sidewall of the first contact hole 116.

The spacer 120 may include an outer sidewall being in contact with the inner sidewall of the first contact hole 116 and an inner sidewall facing the outer sidewall and having a positive slope. That is, the inner and outer sidewalls of the spacer 120 may be substantially parallel to each other. Further, a top surface of the spacer 120 may be positioned substantially at the same level as a top surface of the first interlayer dielectric 114 and a bottom surface of the spacer 120 may be positioned at a substantially lower level than a top surface of the substrate 100. Moreover, a portion of the inner sidewall of the spacer 120 adjacent to the top surface of the spacer 120 may be etched such that the inner sidewall and the top surface of the spacer 120 are joined by a curved surface.

According to some exemplary embodiments of the general inventive concept, during the formation of the spacer 120, the spacer layer 118 may be etched faster on the top surface of the first interlayer dielectric 114 than on a bottom surface of the first contact hole 116. Thus, an upper portion of the first interlayer dielectric 114 may be additionally etched to a specific depth. As the result of this additional etching, the first interlayer dielectric 114 may have a second height H2, which is substantially smaller than the first height H1 (i.e., the initial height). The formation of the first interlayer dielectric 114 may be performed in consideration of the reduction in thickness of the first interlayer dielectric 114 caused by the additional etching. For example, the first interlayer dielectric 114 may be formed to have enough thickness to avoid technical difficulties, which may be caused by the additional etching.

Figure 8A:
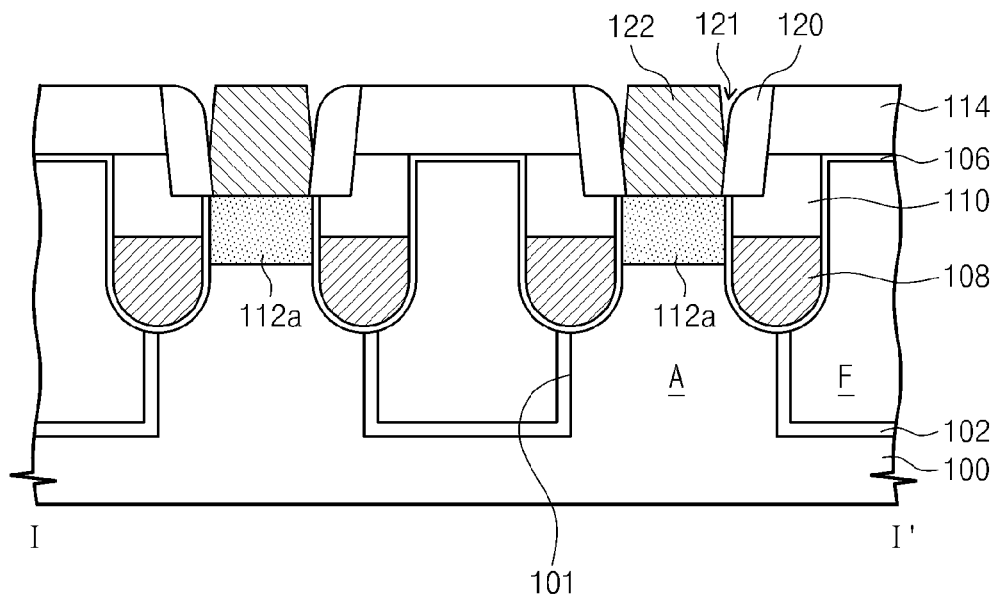
Figure 8B:
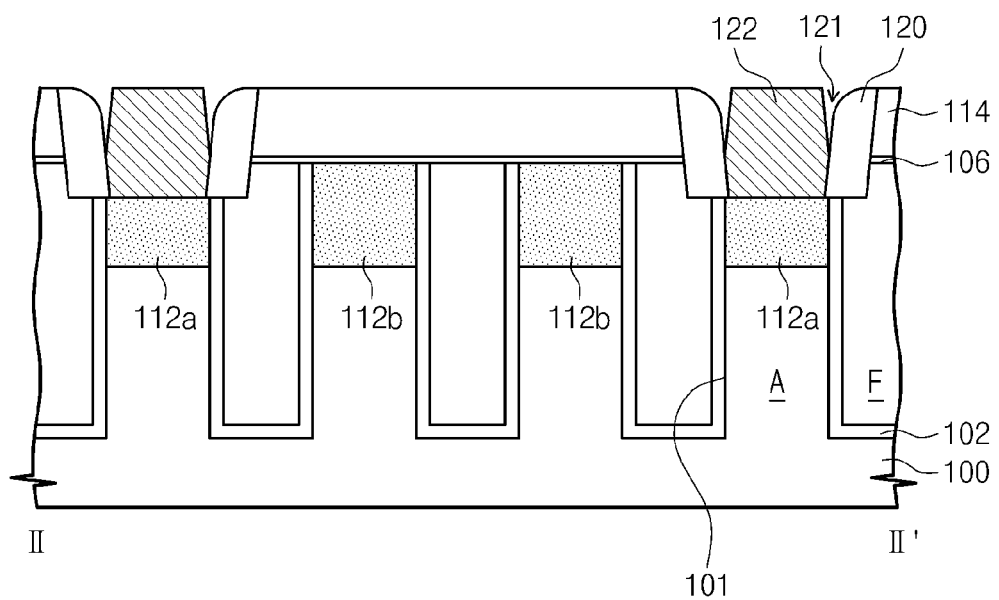

Referring to FIGS. 8A and 8B, a first contact plug 122 may formed to fill the first contact hole 116 provided with the spacer 120.

For example, the formation of the first contact plug 122 may include forming a first conductive layer filling the first contact hole 116 on the first interlayer dielectric 114 and the spacer 120. In some exemplary embodiments, the first conductive layer may include at least one of a doped silicon layer, a metal layer, or a metal compound layer. Thereafter, the first conductive layer may be etched to expose a top surface of the first interlayer dielectric 114, and thereby forming the first contact plug 122 that fills the first contact hole 116 provided with the spacer 120.

According to some exemplary embodiments of the general inventive concept, the first contact plug 122 may be formed using an etching process. In particular, the first contact plug 122 may have a lower portion whose shape is defined by the first contact hole 116 provided with the spacer 120. For example, the first contact hole 116 and the first contact plug 122 may have a downwardly tapered shape, as shown in FIGS. 8A and 8B. That is, as the depth of the contact hole 116 increases, the width of the contact hole 116 decreases. Further, the width of the first contact plug 122 may increase towards the bottom of the contact hole 116 until the first contact plug 122 contacts the spacer 120 of the contact hole 120, and the width of the portions of the first contact plug 120 contacting the spacer 120 may decrease towards the bottom of the contact hole 116 as a result of the first contact plug 122 being defined by the spacer 120 of the first contact hole 116. As the result of the downwardly tapered first contact plug 122, the first contact plug 122 may be spaced farther apart from the gate electrode 108 thereunder. Accordingly, it may be possible to suppress an electric short and a cross talking, which may occur between the first contact plug 122 and the gate electrode 108.

According to other exemplary embodiments, the formation of the first contact plug 122 may include anisotropically etching the first conductive layer using a mask to form an upper portion of the first contact plug 122 having an upwardly tapered shape. That is, the upper portion of the first contact plug 122 may have a sidewall with a positive slope. Due to the upwardly tapered upper portion of the first contact plug 122, it may be possible to prevent the first contact plug 122 from thinning during a subsequent step for forming a bit line.

Figure 9A:
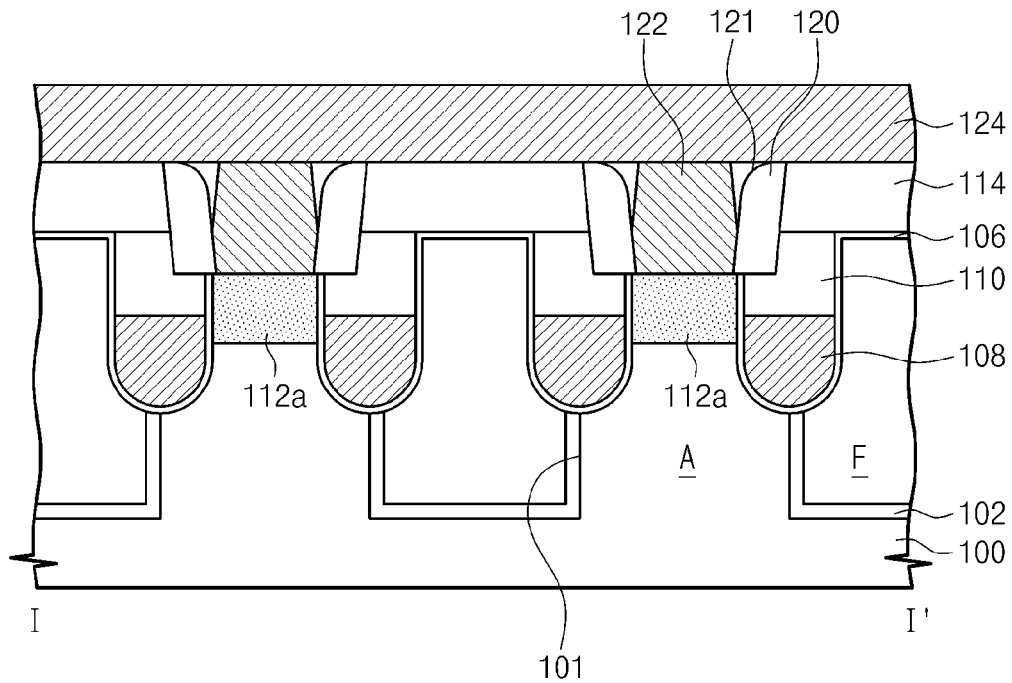
Figure 9B:
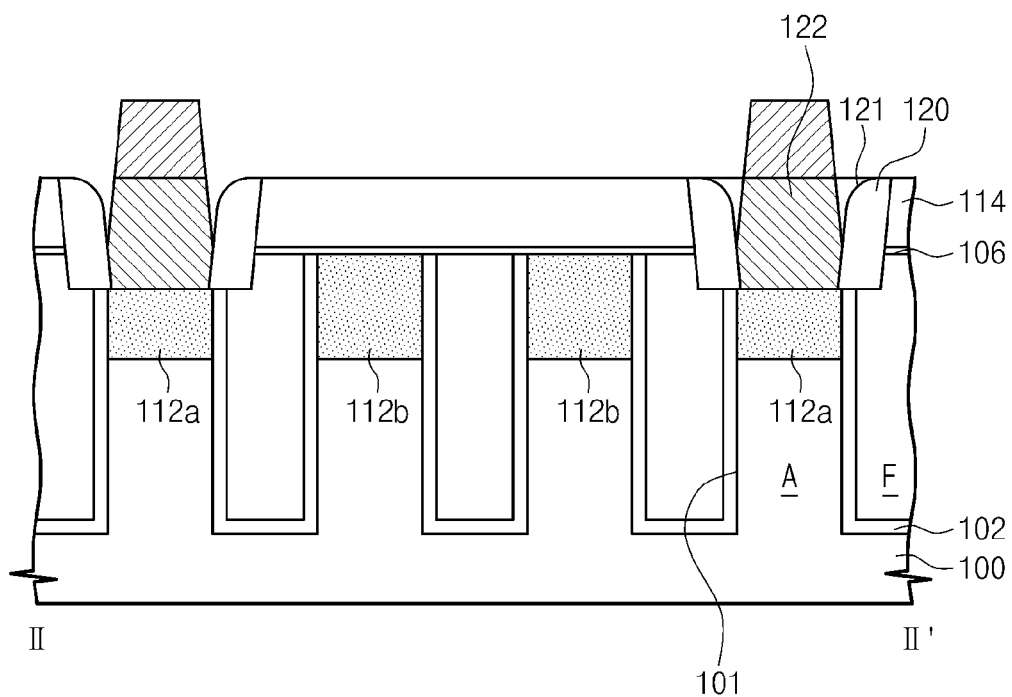

Referring to FIGS. 9A and 9B, a bit line 124 may be formed on the first interlayer dielectric 114. The bit line 124 may be electrically connected to the first contact plug 122.

The bit line 124 may be formed to extend along a third direction, which may be perpendicular to the second direction. Moreover, the first direction may not be parallel to both the second and third directions. For example, the bit line 124 may be substantially perpendicular to a major axis of the gate electrode 108 elongated along the second direction.

The bit line 124 may include at least one of a doped silicon layer, a metal layer, and a metal compound layer. For example, the bit line 124 may have a single layer structure formed of the doped silicon layer, the metal layer, or the metal compound layer, or a multi-layered structure including at least two of the doped silicon layer, the metal layer, and the metal compound layer.

According to some exemplary embodiments of the general inventive concept, in the case where the bit line 124 has the multi-layered structure, the formation of the bit line 124 may include sequentially forming a doped silicon layer and a tungsten layer on the first interlayer dielectric 114 and the first contact plug 122 and patterning the doped silicon layer and the tungsten layer. During the patterning step, the first contact plug 122 disposed under the bit line 124 may be unintentionally etched to be thin. However, according to exemplary embodiments of the general inventive concept, since the upper portion of the first contact plug 122 has the upwardly tapered shape as mentioned above, such thinning of the first contact plug 122 may be suppressed.

According to some exemplary embodiments of the general inventive concept, before the formation of the bit line 124, an insulating material may be formed to fill a gap region between the spacer 120 and the first contact plug 122. In particular, since the first contact plug 122 has an upper sidewall with the positive slope, the gap region 121 may be formed between the spacer 120 and the first contact plug 122. In certain exemplary embodiments, the gap region 121 may be filled with substantially the same material as the spacer 120. For example, the gap region 121 may be filled with a nitride layer.

Figure 10A:
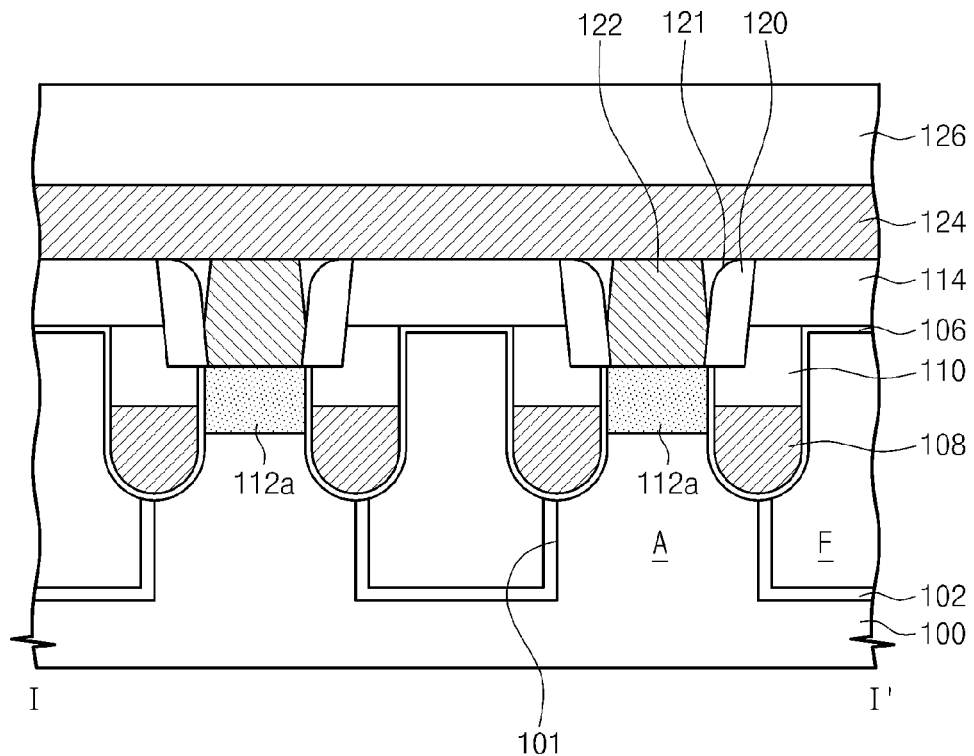
Figure 10B:
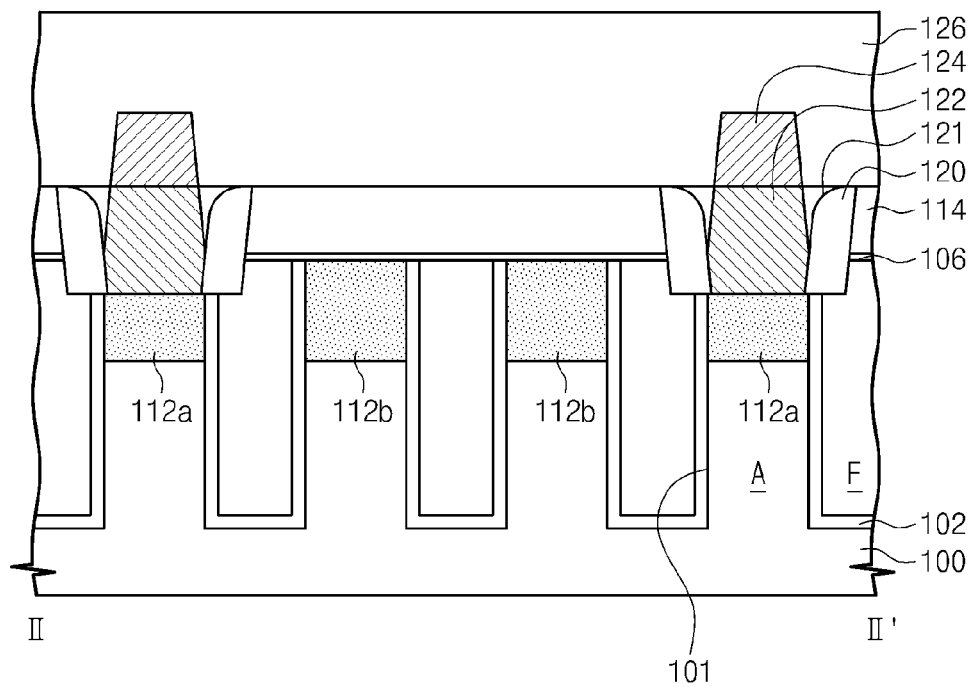

Referring to FIGS. 10A and 10B, a second interlayer dielectric 126 may be formed on the bit line 124. The second interlayer dielectric 126 may include substantially the same material as the first interlayer dielectric 114. For example, the second interlayer dielectric 126 may include an oxide layer such as a silicon oxide layer.

Figure 11A:
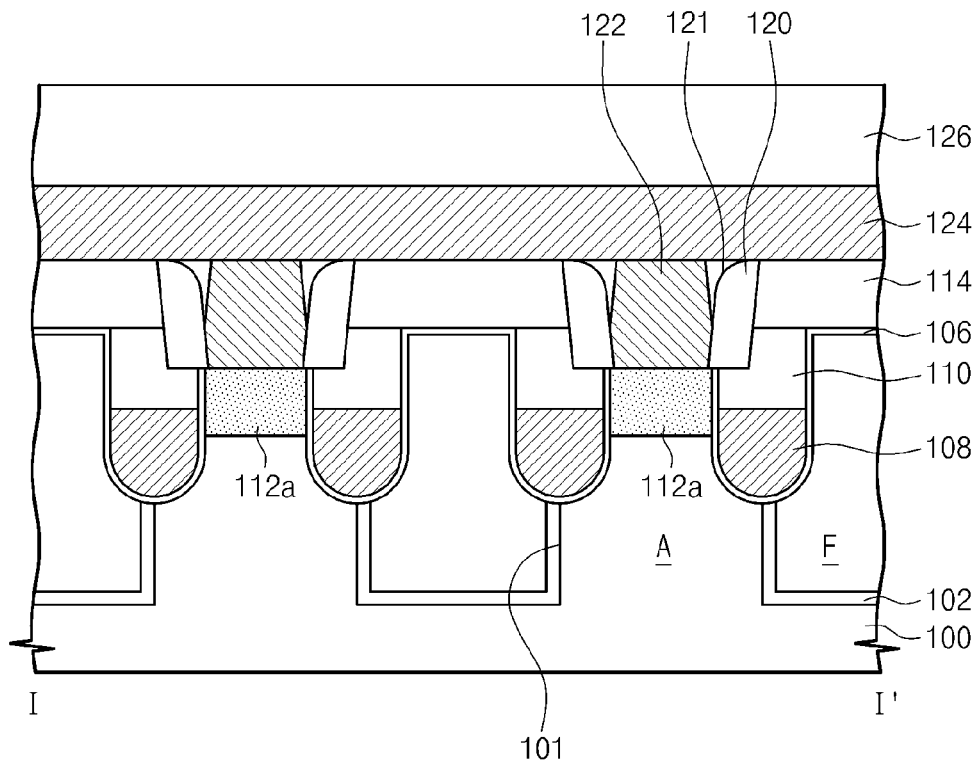
Figure 11B:
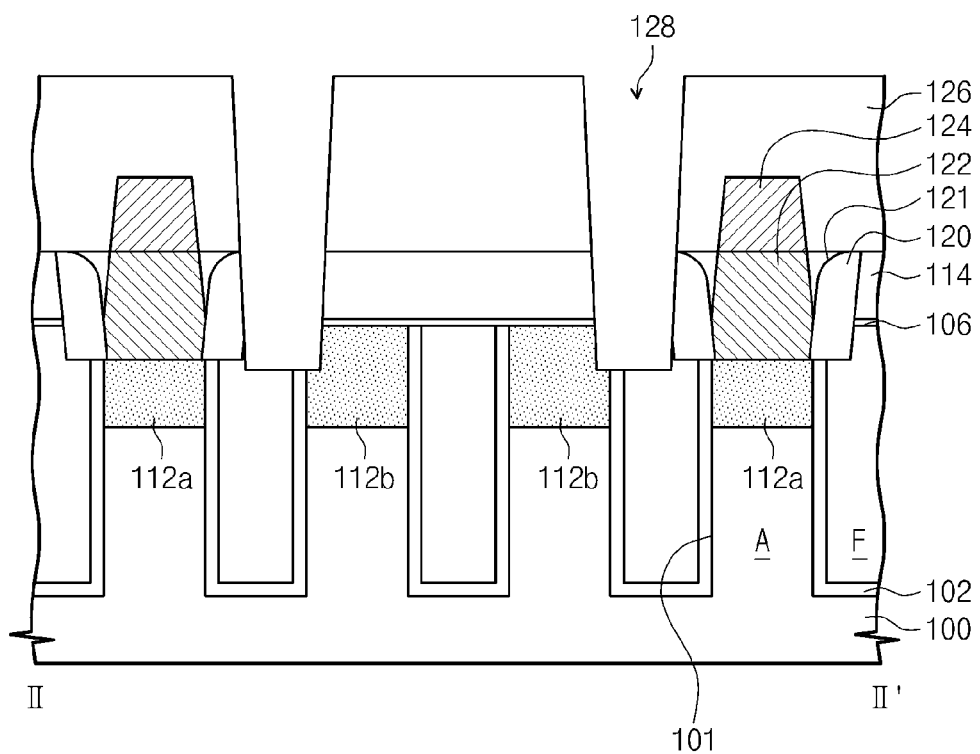

Referring to FIGS. 11A and 11B, the first and second interlayer dielectric 114 and 126 may be etched to form a second contact hole 128 exposing the second doped region 112b.

The second contact hole 128 may be formed by anisotropically etching the second interlayer dielectric 126 and the first interlayer dielectric 114. For example, the formation of the second contact hole 128 may be performed using a plasma etching technique or reactive ion etching technique. The second contact hole 128 may have a downwardly tapered shape as shown in FIGS. 11A and 11B, which may be a result of the anisotropic etching technique. In addition, a bottom surface of the second contact hole 128 may be positioned at a substantially lower level than a bottom surface of the first contact hole 116. Moreover, a width of the second contact hole 128 may be substantially narrower than a width of the first contact hole 116.

In some exemplary embodiments, the second contact hole 128 may be disposed adjacent to the first contact plug 122 according to design specifications. Moreover, the first and second interlayer dielectrics 114 and 126 may include an oxide layer, and the spacer 120 may include a nitride layer. In this case, a portion of the spacer 120 may be exposed during the anisotropic etching of the second interlayer dielectric 126 and the first interlayer dielectric 114. Further, because the spacer 120 may include a different material from the first and second interlayer dielectrics 114 and 126, an etching rate of the spacer 120 may differ from etching rates of the first and second interlayer dielectrics 114 and 126. As a result, the spacer 120 may serve as an etch stop layer during the forming of the second contact hole 128. That is, the spacer 120 may prevent the first contact plug 122 from being exposed by the etching that results in the second contact hole 128.

Figure 12A:
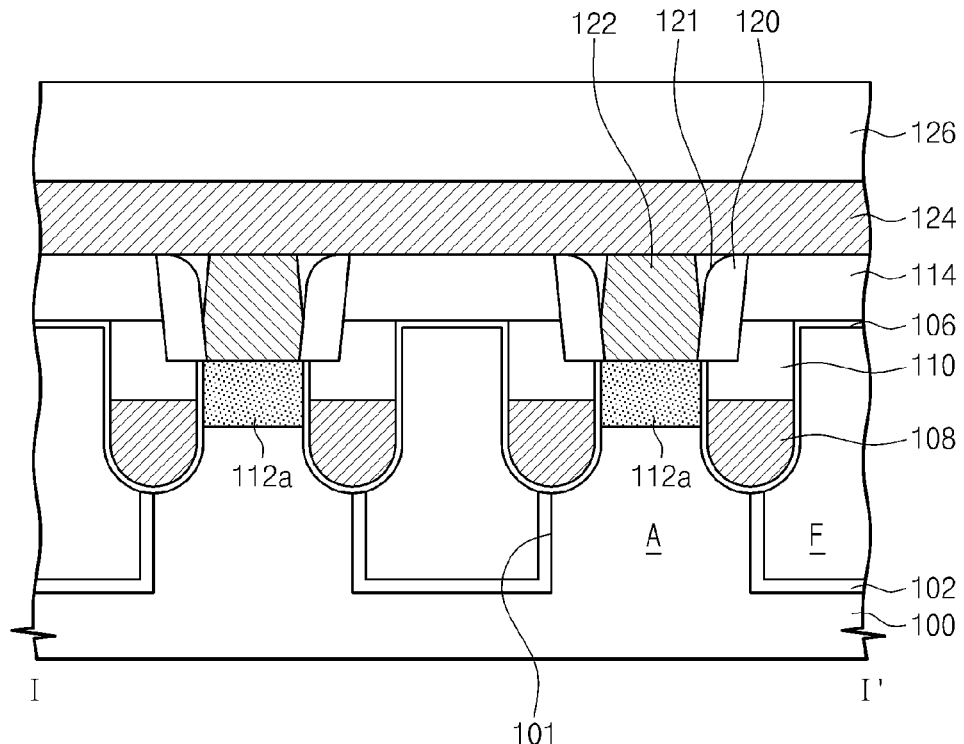
Figure 12B:
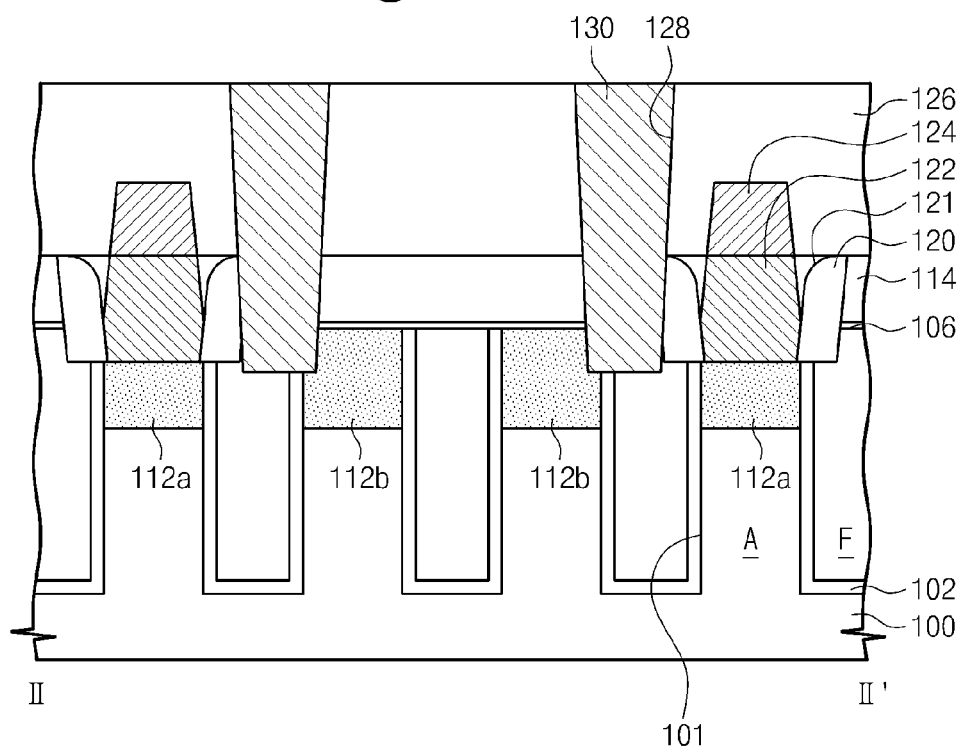

Referring to FIGS. 12A and 12B, a second contact plug 130 may be formed to fill the second contact hole 128.

In particular, the formation of the second contact plug 130 may include forming a second conductive layer, which fills the second contact hole 128, on the second interlayer dielectric 126. In some exemplary embodiments, the second conductive layer may include at least one of a doped silicon layer, a metal layer, and a metal compound layer. Thereafter, the second conductive layer may be etched to expose a top surface of the second interlayer dielectric 126, and as a result, the second contact plug 130 may be formed to fill the second contact hole 128.

A bottom surface of the second contact plug 130 may be positioned at a substantially lower level than a bottom surface of the first contact plug 122. Moreover, in some exemplary embodiments, the second contact plug 130 may include a first portion that is in contact with the second doped region 112b and a second portion that is in contact with the spacer 120. Further, the first and second portions of the second contact plug 130 may also be spaced apart from each other. That is, the first and second portions of the second contact plug 130 may be on opposing sides of the second contact plug 130.

Figure 13A:
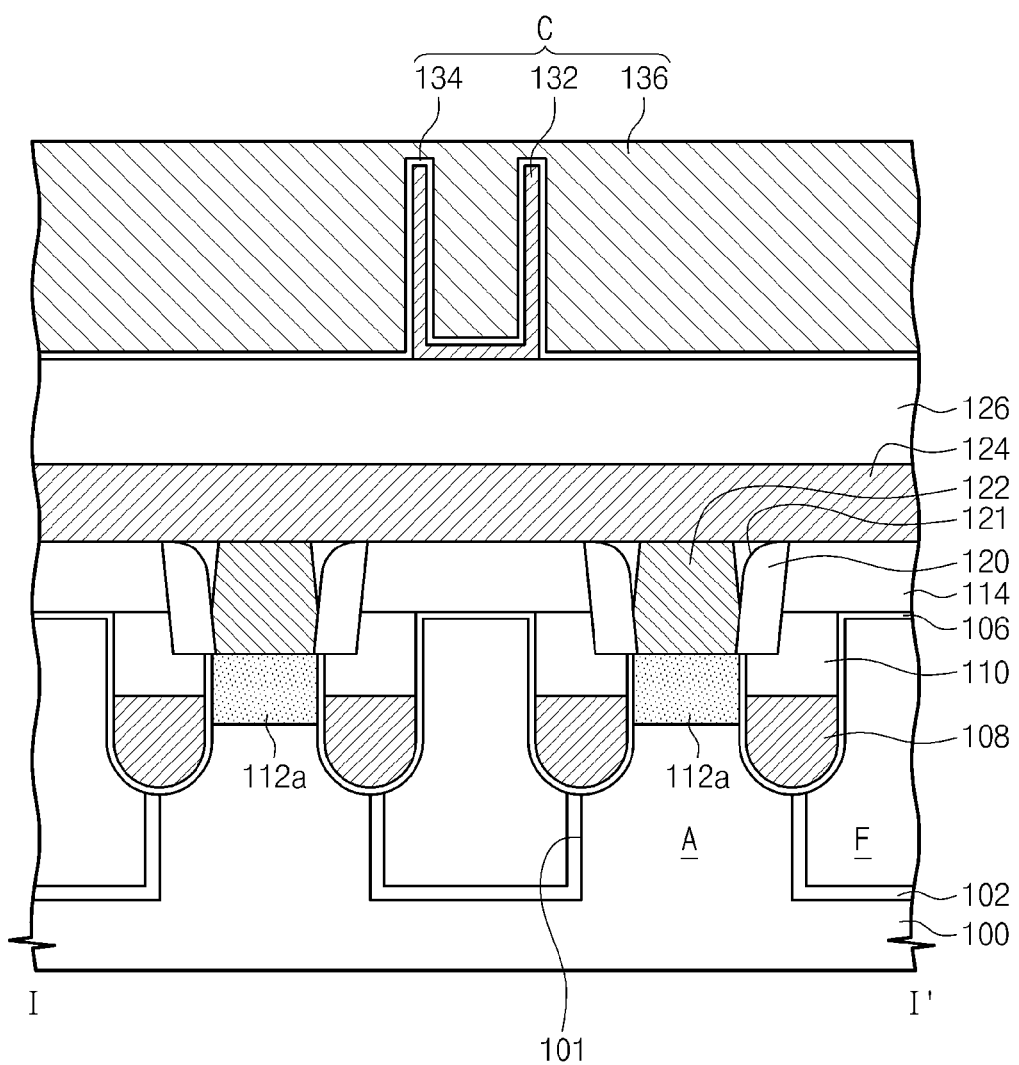
Figure 13B:
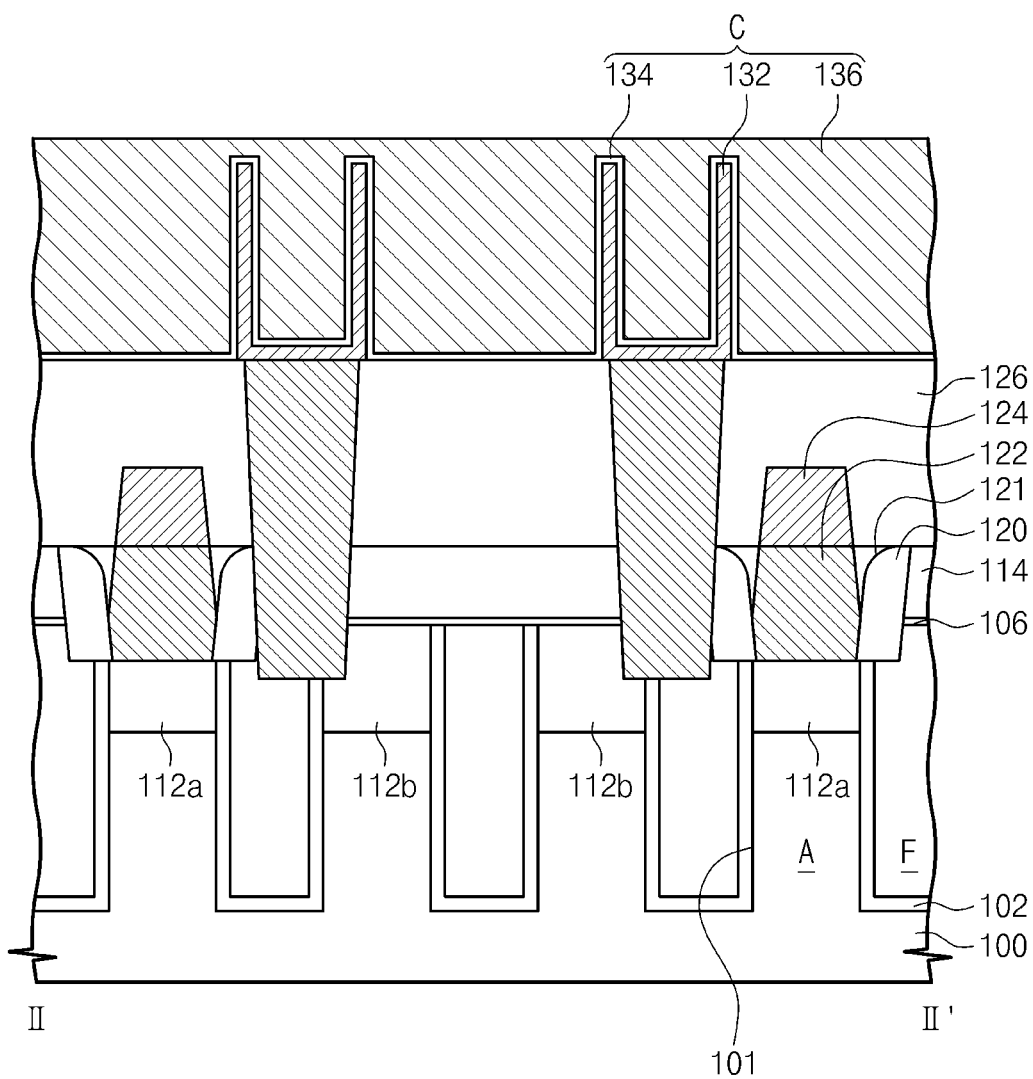

Referring to FIGS. 13A and 13B, a capacitor C may be formed on the second contact plug 130. The capacitor C may be electrically connected to the second contact plug 130 as shown in FIG. 13B.

The capacitor C may include a lower electrode 132, a capacitor dielectric 134, and an upper electrode 136. According to some exemplary embodiments of the general inventive concept, the lower electrode 132 may have, for example, a cup shape or a bottom-closed cylinder shape. However, it should be noted that the lower electrode 132 is provided for better understanding of exemplary embodiments of the general inventive concept, and exemplary embodiments of the general inventive concept are not limited thereto. That is, the capacitor C may be formed in various structures; for example, the capacitor C may have a planar or concave structure.

The following exemplary processes may be used to fabricate the capacitor C including the cup-shaped lower electrode 132. That is, the formation of the capacitor C may include, for example, forming a first sacrificial layer (not shown) on the second interlayer dielectric 126. The first sacrificial layer may be formed to define an opening exposing the second contact plug 130. Next, a third conductive layer (not shown) may be formed on the first sacrificial layer so as to conform to the first sacrificial layer. The third conductive layer may include at least one of a doped silicon layer, a metal layer, and a metal compound layer. Thereafter, a second sacrificial layer (not shown) may be formed to fill the opening provided with third first conductive layer. Next, a node separation process may be performed to form the lower electrode 132 confined within the opening. The node separation process may include partially etching the second sacrificial layer and the third conductive layer to expose a top surface of the first sacrificial layer. After the formation of the lower electrode 132, the first and second sacrificial layers may be removed.

The removal of the first and second sacrificial layers, a capacitor dielectric 134 may be formed on the lower electrode 132 such that the capacitor dielectric 134 conforms to an exposed surface of the lower electrode 132. Next, an upper electrode 136 may be formed on the capacitor dielectric 134. In this case, the upper electrode 136 may be formed to fill the internal space of the lower electrode 132 covered with the capacitor dielectric 134. The upper electrode 136 may include the same material as the lower electrode 132.

Figure 14A:
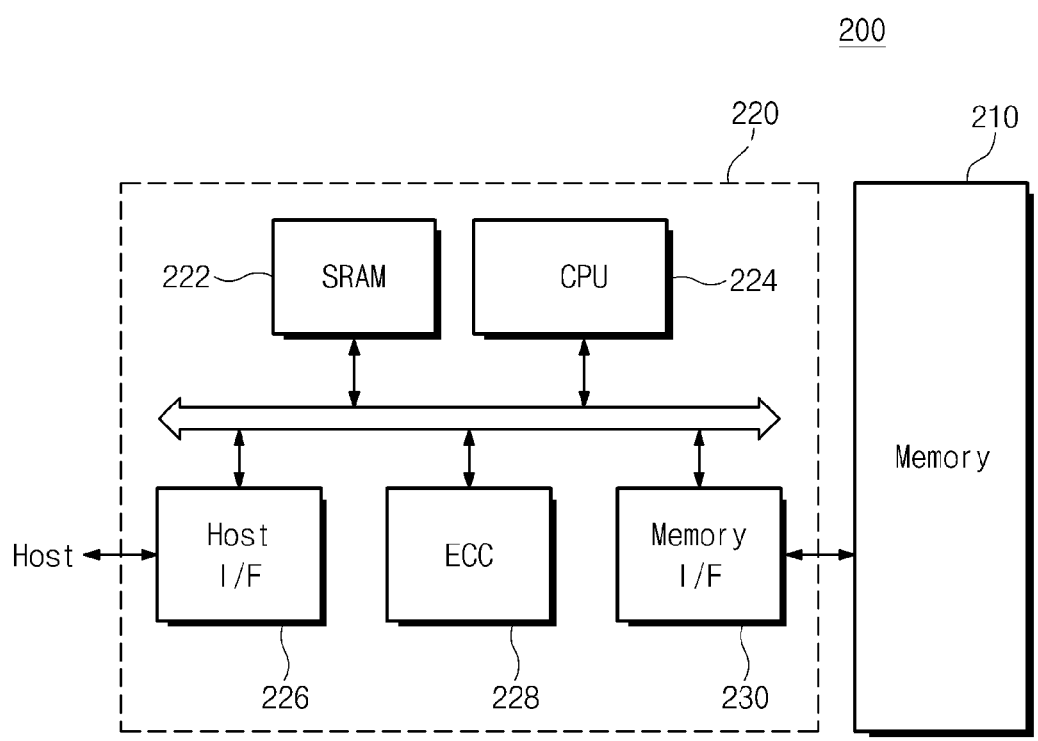
FIG. 14A is a block diagram illustrating a memory card including a memory device according to the exemplary embodiments of the general inventive concept.

FIG. 14A is a block diagram illustrating a memory card including a memory device according to the exemplary embodiments of the general inventive concept.

Referring to FIG. 14A, a semiconductor device according to exemplary embodiments of the general inventive concept may be applied to form a memory card 200. For example, the memory card 200 may include a memory controller 220 to control a data exchange between a host and a semiconductor memory 210. A static random access memory (SRAM) 222 may be used as an operation memory of a central processing unit (CPU) 224. A host interface 226 may include at least one data exchange protocol of the host connected to the memory card 200. An error correction code (ECC) 228 may detect and correct at least one error that may be included in data read from the semiconductor memory 210. A memory interface 230 may interface with the semiconductor memory 210. The central processing unit (CPU) 224 may control data exchange of the memory controller 220 with, for example, the semiconductor memory 210.

The semiconductor memory 210 embodied in the memory card 200 may include the semiconductor device according to exemplary embodiments of the general inventive concept described with reference to FIGS. 1 to 13. Accordingly, the semiconductor memory 210 or the memory card 200 can be fabricated without the occurrence of an electric short and cross talking between the first contact plug 122 and the gate electrode 108. In addition, it can be possible to enhance electric isolation between the first contact plug 122 and the second contact plug 130. Moreover, due to the upwardly tapered upper portion of the first contact plug 122, it may be possible to prevent the first contact plug 122 from thinning during the forming of the bit line 124.

Figure 14B:
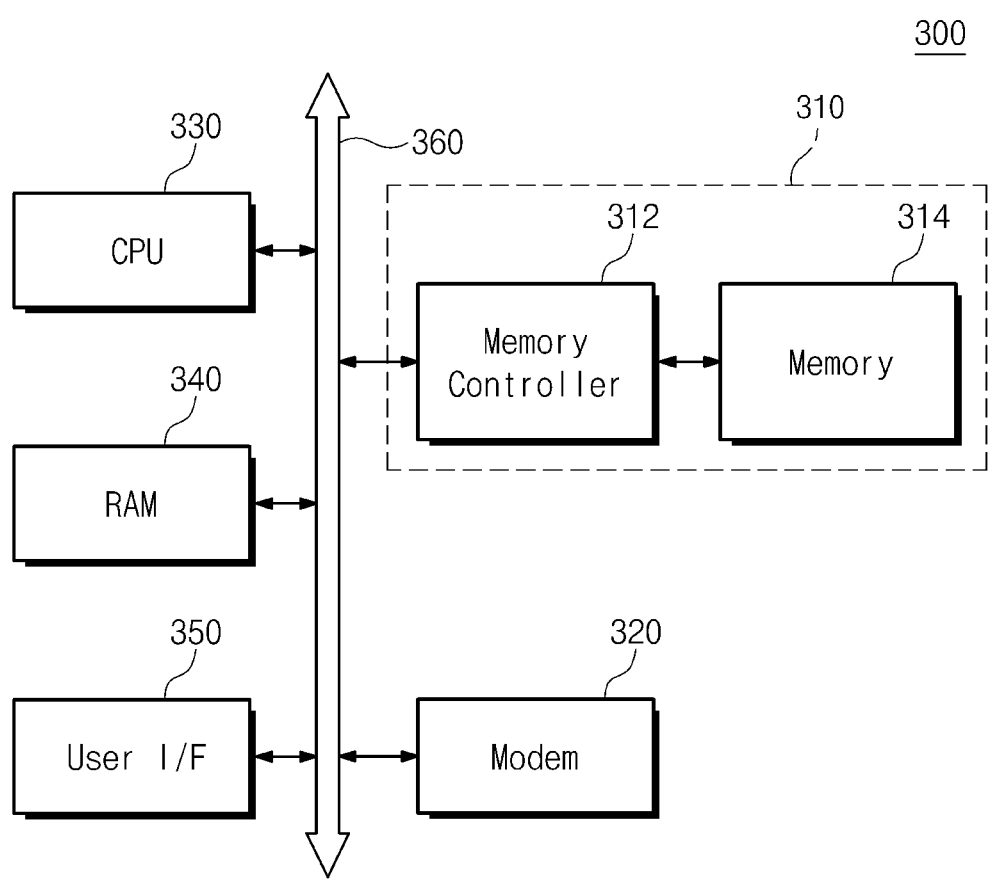
FIG. 14B is a block diagram illustrating an information processing system including a memory device according to exemplary embodiments of the general inventive concept.

FIG. 14B is a block diagram illustrating an information processing system including a memory device according to exemplary embodiments of the general inventive concept.

Referring to FIG. 14B, an information processing system 300 may include a semiconductor memory device according to exemplary embodiments of the general inventive concept. The information processing system 300 may include, for example, a mobile device (cellular telephone, PDA, tablet, etc.) or a computer. As an illustration, the information processing system 300 may include a memory system 310, a modem 320, a central processing unit (CPU) 330, a random access memory (RAM) 340, and a user interface 350 that are electrically connected to a system bus 360. The memory system 310 may store data processed by the central processing unit (CPU) 330 and data inputted from the outside (e.g., via the user interface 350 and/or the modem 320). The memory system 310 may include a memory 312 and a memory controller 314. The memory system 310 may be the same as the memory card 200 described with reference to FIG. 14A. The information processing system 300 may be provided as, for example, a memory card, a solid state disk, a camera image sensor and an application chip set. For example, the memory system 310 may be a solid state disk (SSD). The information processing system 300 may stably and reliably store data in the memory system 310.

According to exemplary embodiments of the general inventive concept, it is possible to suppress the occurrence of electric shorts and a cross talking between the first contact plug 122 and the gate electrode 108. In addition, it can be possible to enhance an electric isolation between the first contact plug 122 and the second contact plug 130. Moreover, due to the upwardly tapered upper portion of the first contact plug 122, it may be possible to prevent the first contact plug 122 from thinning during the forming of the bit line 124.

While exemplary embodiments have been particularly shown and described, it will be understood by one of ordinary skill in the art that variations in form and detail may be made therein without departing from the spirit of the general inventive concept, the scope of which is defined in the appended claims and their equivalents.

What is claimed is:

1. A method of fabricating a semiconductor device, comprising
   forming a transistor on a substrate, the transistor having first and second doped regions;
   forming a first interlayer dielectric on the substrate;
   etching the first interlayer dielectric to form a first contact hole exposing the first doped region;
   forming a spacer on an inner sidewall of the first contact hole to form a space defined by the spacer; and
   filling the first contact hole provided with the spacer with a conductive layer to form a first contact plug,
   wherein the space defined by the spacer increases in width from a bottom side thereof to a top side thereof.

2. The method of claim 1, further comprising:
   forming a bit line electrically connected to the first contact plug;
   forming a second interlayer dielectric covering the bit line;
   etching the first and second interlayer dielectrics to form a second contact hole exposing the second doped region;
   filling the second contact hole with a conductive layer to form a second contact plug; and
   forming a capacitor electrically connected to the second contact plug, wherein the spacer is an etch stop layer preventing the first doped region from being unintentionally etched during the forming of the second contact hole.

3. The method of claim 1, wherein the major axis of each of the plurality of active regions extend in a direct substantially parallel to the major axis of the at least one active region.

4. The method of claim 1, wherein the first contact plug is disposed so as to form a gap region between at least a portion of the contact plug and the spacer.

* * * * *